United States Patent [19]

Fukuda et al.

[11] Patent Number: 4,972,241
[45] Date of Patent: Nov. 20, 1990

[54] MAGNETIC FORCE DETECTING SEMICONDUCTOR DEVICE AND METHOD FOR MANUFACTURING THE SAME

[75] Inventors: Toshikazu Fukuda, Kawasaki; Toru Suga, Tokyo; Yutaka Tomisawa, Yokohama, all of Japan

[73] Assignee: Kabushiki Kaisha Toshiba, Kawasaki, Japan

[21] Appl. No.: 234,652

[22] Filed: Aug. 22, 1988

[30] Foreign Application Priority Data

Aug. 28, 1987 [JP] Japan ................... 62-214312

[51] Int. Cl.$^5$ ................ A01L 27/22; A01L 29/82; A01L 29/96; A01L 43/00
[52] U.S. Cl. ................................. 357/27; 357/72; 338/32 H
[58] Field of Search .............. 357/27, 72; 338/32 H

[56] References Cited

U.S. PATENT DOCUMENTS

| | | | |
|---|---|---|---|
| 4,021,767 | 5/1977 | Nonaka et al. | 357/27 |
| 4,048,670 | 9/1977 | Eysermans | 357/72 |
| 4,188,605 | 2/1980 | Stout | 338/32 H |

FOREIGN PATENT DOCUMENTS

| | | | |
|---|---|---|---|
| 51-283 | 1/1976 | Japan. | |
| 59-34680 | 2/1984 | Japan | 357/27 |
| 59-34681 | 2/1984 | Japan | 357/27 |

Primary Examiner—J. Carroll
Attorney, Agent, or Firm—Finnegan, Henderson, Farabow, Garrett and Dunner

[57] ABSTRACT

A chip including a Hall element for detecting a magnetic force is p repared. On the chip is formed an unhardened magnetic resin layer, which is formed of a mixture of soft magnetic powder an dsilicone rubber. The unhardened magnetic resin layer is applied with a magnetic field and is stretched in a direction perpendicular to one face of the chip, so that its top portion is formed in a substantially conical shape and its bottom portion is formed in a substantially rectangular block, the ratio of the length Wa of its base to its height Wb, Wb/Wa, being equal to or greater than 1. The magnetic resin layer is then hardened. As a result, a magnetic force detecting semiconductor device is provided, which has a magnetic resin layer with a high magnetic force convergence that has its top portion formed in a conical shape and its bottom portion formed in a rectangular block, the ratio of the length of its base to its height being equal to and greater than 1.

6 Claims, 3 Drawing Sheets

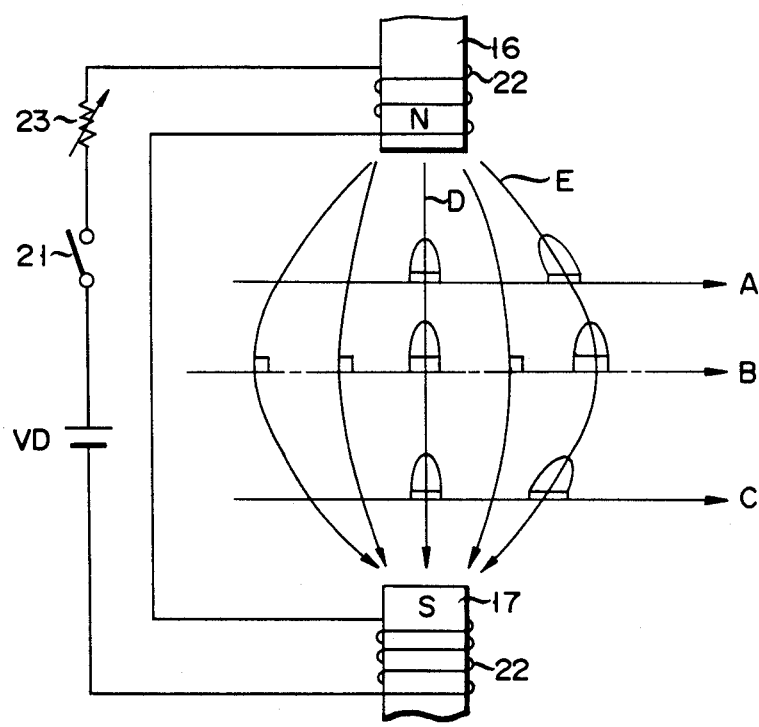
F I G. 5
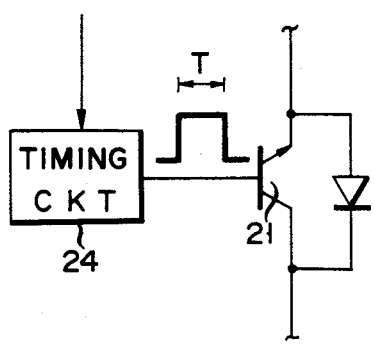
F I G. 6
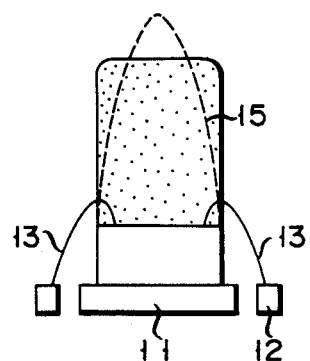
F I G. 7

MAGNETIC FORCE DETECTING SEMICONDUCTOR DEVICE AND METHOD FOR MANUFACTURING THE SAME

BACKGROUND OF THE INVENTION

1. Field of the Invention

The present invention relates to a magnetic force detecting semiconductor (semiconductor magnetometry) device, for example, a magnetoelectric converting device or a magnetoresistive element and a method for manufacturing the same, and, more particularly, the shape of a magnetic resin layer to be coated on a chip for improvement of the sensitivity and a method for shaping the layer.

2. Description of the Related Art

A conventional Hall element is, as shown in FIG. 1, are formed by mounting a magnetic force detecting element chip 2 on an island 1 of a lead frame, coupling the electrodes of the chip 2 to lead terminals 3-6 by metal wires 7, and forming a mold 9 of resin. In order to strengthen the magnetic field acting on an active layer of chip 2 to improve the sensitivity of the Hall element, a magnetic resin layer 8 shown in FIG. 2 is generally formed on element chip 2. This resin layer 8 is formed by coating, and hardening, a magnetic resin on chip 2 in a hemisphere (or dome) shape, its height being about 0.5 times the length of one side of chip 2.

Conventionally, magnetic resin layer 8 essentially consists of a mixture of an epoxy resin and a soft magnetic powder. However, the thermal expansion coefficient of the epoxy resin differs significantly from that of chip 2, and in the conventional device, force is applied on chip 2 due to the stress generated by the hardening of the epoxy resin or the heat cycle after the hardening process. This increases the unbalanced voltage of the Hall element, thus deteriorating the characteristic, such as setting the output voltage not in proportion to the input current.

SUMMARY OF THE INVENTION

It is an object of this invention to provide a magnetic force detecting semiconductor device with higher performance and higher reliability.

To achieve the above objects, a magnetic force detecting device according to this invention comprises:

a chip (11) for detecting a magnetic field intensity; and a magnetic flux converging layer (15), disposed on the chip (11) and having a height (Wb) equal to or greater than a length of a base thereof, for converging a magnetic flux on the chip (11).

A method for manufacturing a magnetic force detecting semiconductor device according to this invention comprises the steps of:

preparing a semiconductor chip (11) including a magnetic force detecting element for detecting a magnetic force;

providing an unhardened magnetic resin layer (14) on the semiconductor chip (11), for forming a magnetic flux converging layer (15) to converge a magnetic flux;

applying a magnetic flux (H) to the unhardened magnetic resin layer (14), giving stress thereon and stretching the magnetic resin layer (14) in a direction of the magnetic flux (H); and hardening the unhardened magnetic resin layer (14) to form the magnetic flux converging layer (15) on the chip (11).

According to the magnetic force detecting semiconductor device embodying this invention, the height (Wb) of the magnetic resin layer (14) is equal to or greater than the length (Wa) of its base. This design increases the ability of the magnetic resin layer (14) to converge the magnetic flux on the chip (11) as compared with that of the prior art, and improves the sensitivity of the device. The method for manufacturing a magnetic force detecting semiconductor device according to this invention can provide a magnetic force detecting semiconductor device which has such improvements.

BRIEF DESCRIPTION OF THE DRAWINGS

FIG. 5 is a diagram for explaining the method for applying a magnetic force to a magnetic force detecting device;

FIG. 6 is a diagram for explaining the practical structure of a switch shown in FIG. 5; and FIG. 7 is a side view illustrating the structure of a magnetic force detecting semiconductor device according to another embodiment of this invention.

DETAILED DESCRIPTION OF THE PREFERRED EMBODIMENTS

The structure and operation of a magnetic force detecting semiconductor device according to one embodiment of this invention will be described below with reference to the accompanying drawings.

To begin with, the structure of a Hall element used in this embodiment will now be described.

Figure 1:
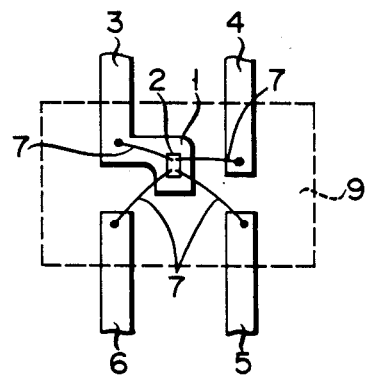
FIG. 1 is a plan view for explaining the structure of a conventional magnetic force detecting device.
Figure 2:
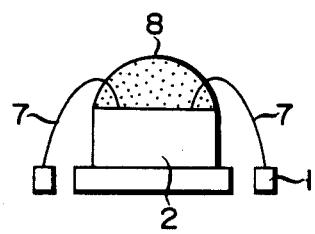
FIG. 2 is an enlarged side view illustrating the size relation between a chip and a magnetic resin layer, as shown in FIG. 1.
Figure 3:
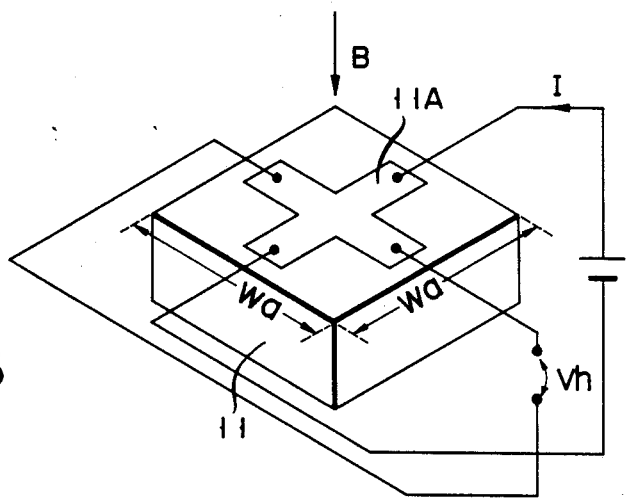
FIG. 3 is a perspective view for explaining the structure of a Hall element according to one embodiment of this invention.

As shown in FIG. 3, the Hall element of this embodiment comprises a GaAs substrate 11 and a cross-shaped active layer 11A formed in the substrate 11. The intensity of an applied magnetic field B is attained by detecting a Hall voltage Vh generated by a current I flowing through the active layer 11A.

The description of a method for manufacturing a magnetic force detecting device according to this embodiment will now be give, referring to FIGS. 4A through 4D.

Figure 4:
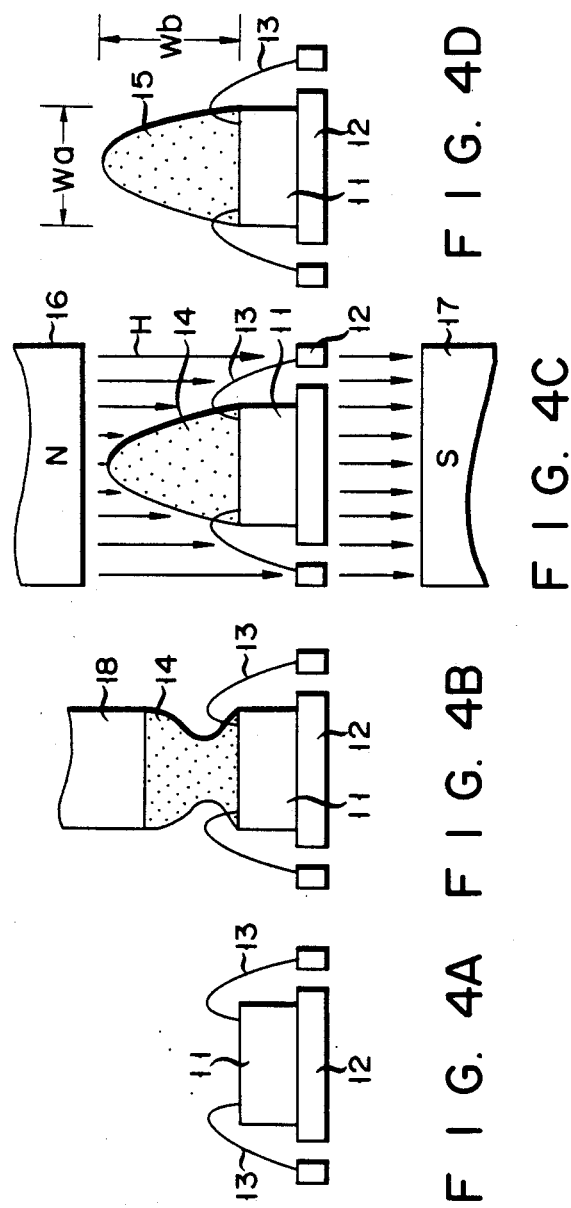
FIGS. 4A through 4D are diagrams for explaining a method for manufacturing a magnetic force detecting device according to one embodiment of this invention.

Hall elements formed on a GaAs wafer are separated into a plurality of chips 11, each of which is mounted on an island 12 of a lead frame by die bonding, as shown in FIG. 4A. The electrodes of chip 11 are coupled to lead terminals by metal wires (e.g., Au wires) 13.

Then, as shown in FIG. 4B, a mixture 14 of soft magnetic powder (such as MnZn ferrite or NiCuZn ferrite) and silicone resin (such as silicone rubber or dimethylpolysiloxane) attained by, for example, the three roll mill method is coated on chip 11 by means of a dispenser 18. The weight ratio of the soft magnetic powder to the silicone resin in the mixture 14 is 7-9 to 3-1; in this case, it is desirable that dispenser 18 have a good coating-amount controllability so as to avoid causing mixture 14 to flow over chip 11.

Then, as shown in FIG. 4C, chip 11 is displaced between magnetic poles 16 and 17 and a magnetic field H is applied for a given time to chip 11 in a direction substantially perpendicular to that surface of chip 11 on which active layer 11A is formed, i.e., in the height direction of chip 11. This application of field H causes the soft magnetic powder in mixture 14 to receive force in the direction opposite to the direction of field H, thus forming mixture 14 almost in a conical shape. (As chip 11 has a rectangular surface, mixture 14 does not have a complete conical shape; a magnetic resin layer 15 has a rectangular block shape at its base portion and has a conical shape at its upper portion.) The intensity of the applied magnetic field H is 0.5 to 3 kG, for example, and the time for the application is 2 to 5 seconds. In this case, since mixture 14 receives force in the direction to be stretched upward, it will not flow over chip 11. The ratio of the length of the base of the conical shape to the height thereof can be adjusted with a good controllability by controlling the field intensity and the application time. During or after the application of magnetic field H, the surface of mixture 14 is heated at, for example, 150° to 250° C. for 3-5 seconds using an infrared lamp, thereby hardening the surface portion of mixture 14.

As shown in FIG. 4D, mixture 14 is hardened by the heat drying process to provide chip 11 having a magnetic resin layer 15 with the desired shape. Then, a resin mold is formed which encloses island 12, chip 11, metal wires 13, magnetic resin layer 15 and inner lead portions of the lead terminals and the lead terminals are subjected to the necessary process, thereby completing a magnetic force detecting device according to this embodiment.

With the structure shown in FIG. 4D, magnetic resin layer 15 has its height Wb equal to or greater than the length of its base Wa. The use of thus shaped magnetic resin layer 15 improved the effect for converging the magnetic flux and made the magnetic/electric converting sensitivity of the Hall element greater than that of the conventional Hall element. Given that B (kG) is the applied magnetic field and Vh (mV) is the output voltage, $Vh = K \cdot B \cdot I$.

According to one experiment conducted by the present inventor, the proportional constant K of the conventional magnetic force detecting device having a magnetic resin layer with a height Wb of 180 μm formed on chip 11 with a width Wa of 360 μm (i.e., Wb/Wa=0.5) is $32 \times 10^{-3}$/kG, whereas the constant K of a magnetic force detecting device having a 360 μm high (Wb) magnetic resin layer formed on 360 μm wide (Wa) chip 11 (i.e., Wb/Wa=1) is $45 \times 10^{-3}$/kG. In this experiment, the proportional constant K is about 1.4 times greater than the that of the conventional case.

Further, according to this embodiment, magnetic resin layer 15 is formed of silicone resin, preferably, silicone rubber resin. As the silicone resin and the GaAs substrate have relatively close thermal expansion coefficients, it is possible to prevent magnetic resin layer 15 from giving large force on chip 11. Therefore, the adverse effects, such as deterioration of the characteristic and reduction in reliability, of the otherwise possible large force acting on chip 11 can be prevented. This embodiment is significantly effective in view of the fact that a Hall element receiving even slight force would generate an unbalanced voltage and is easily influenced by the applied force.

According to the above embodiment, only the surface portion of mixture 14 is hardened before the mixture is hardened. With this process, even if mixture 14, after stretched by magnetic field H, is left for more than 24 hours, its height Wb does not get lower. Accordingly, mixture 14 can be slowly hardened. In contrast, if mixture 14 is left with its surface portion unhardened, its height Wb would be reduced due to the influence of the surface tension of unhardened mixture 14, gravity, or the like. If mixture 14 is rapidly hardened, the resultant magnetic resin layer 15 may have cracks. In these respects, it is effective to first harden only the surface portion of mixture 14 and then slowly harden the mixture 14 to thereby form magnetic resin layer 15.

For ease of understanding, the foregoing description of the embodiment has been given with reference to the case where the lines of magnetic force of the applied field H are parallel to one another. Actually, as shown in FIG. 5, magnetic field H has a leakage flux so that some portions of the lines of magnetic force may not be parallel to one another. If mixture 14 is moved over the arrows A and C so that magnetic field H is applied to the mixture for a given time, therefore, mixture 14 would receive the oblique force and would be stretched in the oblique direction, as shown in FIG. 5. In this respect, therefore, according to this embodiment, the Hall elements are moved over the arrow B. As the arrow B lies at the middle between two magnetic poles 16 and 17 and the lines of magnetic force intersect at right angles, moving chip 11 substantially over the arrow B stretches mixture 14 in the direction perpendicular to chip 11.

In the above embodiment, permanent magnets are used as magnetic poles 16 and 17; however, electromagnets may be used instead. With electromagnets serving as magnetic poles 16 and 17, a switch 21 may be switched ON only while chip 11 is on the line connecting poles 16 and 17 to supply a current to coils 22 and this switch 21 may be switched OFF to cut off the current after mixture 14 is stretched to a given length so that the Hall elements can be taken. In this manner, even if the Hall elements are moved over the arrows A and C in FIG. 5, no oblique force would act on mixture 14 and hence the mixture 14 extends in the direction perpendicular to one face of chip 11.

Although, in the above embodiment, magnetic field H of a constant intensity is applied to the Hall element, this invention is not limited to this particular case. For instance, as shown in FIG. 5, the resistance of resistor 23 may be varied to change the current flowing through coils 22 of electromagnets. With this structure, the intensity of magnetic field H can be controlled by reducing the resistance of resistor 23 when the viscosity of mixture 14 is high and increasing the it when that viscosity is low, thereby always ensuring a constant ratio Wb/Wa. Similarly, the time for applying magnetic field H may be varied. For instance, with permanent magnets in use, the speed for moving the Hall element over the arrow B may be increased or decreased to vary the time for applying field H to mixture 14. With electromagnets in use instead, a transistor may be used for switch 21 as shown in FIG. 6 and the pulse width T of the output pulse of a pulse circuit 24 may be varied to change the field applying time. The above arrangement can control the ratio Wb/Wa to be always constant.

According to the manufacturing method of the embodiment, magnetic resin layer 15 having a substantially conical shape (its base portion being a substantially rectangular block) can easily be formed by controlling the intensity of magnetic field H and the field applying time.

Although magnetic resin layer 15 has a substantially conical shape in the foregoing embodiment, this invention is not limited to this particular shape. The key point is that the height Wb of magnetic resin layer 15 is equal to or greater than length Wa of its base; the layer 15 may therefore be formed in a columnar shape as shown in FIG. 7. This shape can easily be formed by first forming magnetic resin layer 15 in a substantially conical shape with its base portion formed in a rectangular block and then pressing the top portion of the layer 15. The columnar shape permits the effective use of the volume of the mold for the magnetic force detecting device and thus improves the detection sensitivity as compared with the device having layer 15 shaped as shown in FIG. 4D.

According to the embodiments, the magnetic resin layer is prepared by hardening mixture 14. Thus formed layer prominently reduces the influence of the hysteresis, as compared with solid ferrite secured on chip 11 by means of an adhesive, etc.

This invention is not limited to the Hall element provided according to the above embodiments, but can be applied to other ordinary magnetic force detecting semiconductor elements. This invention, however, is effective particularly for the Hall element which has an active layer formed on a GaAs substrate, as used in the embodiments for the following reason. As GaAs substrate elements have been developed whose width Wa is approximately 200–400 $\mu$m, the magnetic resin layer has only to be 200–400 $\mu$m high. In contrast, the conventional Hall elements made of an indium-base material has one side of its base greater than 1 mm and the resin layer needs to be more than 1 mm high, thus undesirably enlarging the magnetic force detecting device. For this reason, the GaAs magnetic force detecting device is the optimum choice.

Although the description of the above embodiments have been given with reference to a chip having a square shape, this invention is not limited to this case. With a rectangular chip in use, the height of the magnetic resin layer needs to be equal to or greater than the length of the longer side of the chip. If the chip is circular, the height of the magnetic resin layer needs to be equal to or greater than the diameter of the chip. In addition, active layer 11A is not limited to a cross shape but may have other different shapes.

What is claimed is:

1. A semiconductor device comprising:
   semiconductor chip means having a magnetic force detecting element, formed in one major surface thereof, for detecting a magnetic field intensity; and
   magnetic flux converging means, provided on said one major surface of said chip means and having a substantially conical shape and a central height equal to or greater than a length of a base thereof, for converging a magnetic flux on said chip means, said magnetic flux converging means being formed of a mixture of soft magnetic powder and resin.

2. The device according to claim 1, wherein said one major surface of said chip means has a rectangular shape, and
   said magnetic flux converging means is formed on said one major surface and has a base portion formed in a substantially rectangular block and a top portion formed in a substantially conical shape.

3. The device according to claim 1, wherein said one major surface of said chip means has a square shape, and
   said magnetic flux converging means is formed on said one major surface and has a substantially rectangular columnar shape.

4. The device according to claim 1, wherein said resin includes silicone rubber.

5. The device according to claim 1, wherein said soft magnetic powder includes ferrite powder.

6. The device according to claim 1, wherein the base of said magnetic flux converging means is the same size as said one major surface.

* * * * *